United States Patent [19]

Haque

[11] 4,365,204

[45] Dec. 21, 1982

[54] OFFSET COMPENSATION FOR SWITCHED CAPACITOR INTEGRATORS

[75] Inventor: Yusuf A. Haque, San Jose, Calif.

[73] Assignee: American Microsystems, Inc., Santa Clara, Calif.

[21] Appl. No.: 185,356

[22] Filed: Sep. 8, 1980

[51] Int. Cl.³ ............................................. G06G 7/18
[52] U.S. Cl. ................................... 328/127; 328/162; 330/9
[58] Field of Search ........................... 330/9, 51, 107; 328/127, 162; 333/173

[56] References Cited

U.S. PATENT DOCUMENTS

| | | | |
|---|---|---|---|
| 3,667,055 | 5/1972 | Uchida | 328/127 |
| 3,879,668 | 4/1975 | Edwards | 328/145 |
| 4,163,947 | 8/1979 | Weedon | 328/128 |
| 4,302,689 | 11/1981 | Brodie | 328/151 X |

FOREIGN PATENT DOCUMENTS 2093486  1/1972  France .
1421768  1/1976  United Kingdom .

OTHER PUBLICATIONS

Hosticka et al., "MOS Sampled Data Recursive Filters Using Switched Capacitor Integrators," *IEEE Journal of Solid-State Circuits*, vol., SC-12, No. 6, Dec. 1977, pp. 600-607.

*Primary Examiner*—James B. Mullins
*Attorney, Agent, or Firm*—Alan H. MacPherson; Steven F. Caserza; Richard Franklin

[57] ABSTRACT

An integrator circuit utilizing an operational amplifier and switched capacitor elements in place of resistors in such a manner as to provide compensation for voltage offsets present in the operational amplifier resulting in an output voltage free from the effects of voltage offsets inherent in operational amplifiers.

7 Claims, 10 Drawing Figures

OFFSET COMPENSATION FOR SWITCHED CAPACITOR INTEGRATORS

BACKGROUND OF THE INVENTION

1. Field of the Invention

This invention relates to the use of electronic circuits as integrators and more specifically to a means for eliminating error in the output voltage of an integrator due to offset voltages inherent in operational amplifiers used in integrators.

2. Description of the Prior Art

Prior art integrators are well known. The simplest form of integrator utilizing an operational amplifier requires a capacitive element with capacitance C to act as a path for negative feed back from the output of the operational amplifier to its inverting input. A resistive element with resistance R is connected in series between the input voltage to be integrated and said inverting input of the operational amplifier. The time constant for such an integrator is simply RC. All operational amplifiers inherently have voltage offsets present on their input and output terminals due to finite component mismatches. The magnitude of each of these voltage offsets is a unique characteristic of each individual operational amplifier and is a source of error in each operational amplifier output signal. Integrators fabricated utilizing MOS techniques have been constructed utilizing switched capacitors in place of resistive elements. Switched capacitor integrators constitute an improvement over integrators utilizing resistive elements due to the fact that resistance values of diffused resistors are not highly controllable in MOS circuits while the ratios of capacitance values are more controllable. However, switched capacitor resistive equivalents have no effect on the inherent offset of the operational amplifiers used in switched capacitor MOS integrators. Thus, output voltage errors due to voltage offsets of operational amplifiers are present both in integrators utilizing resistive and capacitive elements and in integrators utilizing switched capacitor elements in place of said resistive elements.

To improve accuracy it is desirable to reduce or eliminate the voltage offset associated with the output signal of an operational amplifier.

SUMMARY OF THE INVENTION

This invention utilizes a unique circuit configuration wherein the offset voltage of the operational amplifier used in the integrator is sampled and held each time the operational amplifier integrator is initialized (i.e. reset to zero). This sample voltage is then fed back to the input of the integrator in such a manner as to eliminate the effects of the offset of the operational amplifier at the output of the integrator.

In actual operation of the circuit of this invention, the offset voltage is sampled and held on a fixed capacitor. This sampled voltage is fed to a unity gain buffer amplifier. The output voltage from this buffer amplifier is applied to a first capacitor plate of an input sample and hold circuit, with the input voltage being applied to a second plate of the capacitor. In this manner, a voltage is stored having a magnitude equal to the difference between the input voltage being sampled, and the offset voltage of the operational amplifier. This voltage is then applied to the integrator operational amplifier, with the effect of cancelling the error generated in prior art integrators due to operational amplifier offsets.

DESCRIPTION OF THE PREFERRED EMBODIMENT

Figure 1:
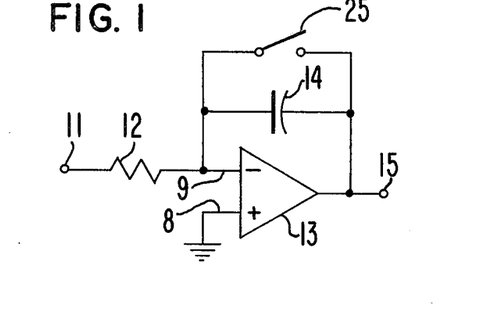
FIG. 1 is a typical prior art integrator utilizing resistive and capacitive elements.

Integrators are well known in the prior art. One such prior art integrator is shown in FIG. 1. Operational amplifier 13 is used in the inverting mode with capacitor 14 supplying negative feedback from operational amplifier output 15 to inverting input 9. The input voltage to be integrated is applied to the inverting input 9 of operational amplifier 13 through resistor 12 from terminal 11. If resistor 12 has a resistance value of R and capacitor 14 has a capacitance value C, the time constant for this integrator is:

$$T = RC \tag{1}$$

Switch 25 is connected in parallel across capacitor 14 in order to initialize the integrator by discharging capacitor 14. An ideal operational amplifier 13 will always have inverting input 9 at the same potential as noninverting input 8, which is connected to ground in the circuit of FIG. 1. An ideal operational amplifier will therefore have its output terminal 15 at ground potential as well. Thus, after initialization has been completed by discharging capacitor 14 through closed switch 25, an ideal operational amplifier connected as shown in FIG. 1 may begin integrating the voltage applied at terminal 11, and the result of the integration will appear at output terminal 15 of operational amplifier 13.

Actual operational amplifiers are imperfect in that the output voltage contains an error component known as the offset voltage ($V_{OFF}$). Offset voltages exist due to finite component mismatches within the operational amplifiers. Thus in the circuit of FIG. 1 if operational amplifier 13 is an actual operational amplifier rather than an ideal operational amplifier, the initialized voltage appearing at output 15 and inverting input 9 of operational amplifier 13 with switch 25 closed will not be zero but will be the offset voltage, $V_{OFF}$. This causes the output voltage available at terminal 15 to be consistently erroneous by a factor of $V_{OFF}$. Because the magnitude of $V_{OFF}$ is unique for each individual operational amplifier circuit due to unique component mismatches, elimination of the effects of $V_{OFF}$ is difficult to obtain when manufacturing a large number of circuits. For this reason, operational amplifiers constructed as individual integrated circuits generally have external pins utilized specifically for applying external voltages, as generated by external circuitry, to null the offset of the operational amplifier. However, integrators contained as a subcircuit of an integrated circuit chip do not provide the end user with external access to the operational amplifier unless additional pins on the integrated circuit package are specifically made available for this purpose. In all but the most rare circumstances this is totally impractical. It is also undesirable to require external circuitry to eliminate $V_{OFF}$.

In the construction of metal oxide silicon (MOS) semiconductor devices, values of resistors and capacitors are not highly controllable. Thus in the integrator circuit shown in FIG. 1 with the time constant equal to RC, circuits constructed utilizing MOS techniques will result in highly uncontrollable time constants.

In practice, resistors are generally formed by diffusion, resulting in resistance values and resistance ratios which are not highly controllable. Capacitors are formed by utilizing layers of conductive material, such as metal or polycrystalline silicon, as capacitor plates. Each plate of conductive materials is separated by a layer of electrical insulation material, such as $SiO_2$ or silicon nitride, serving as a dielectric, from another conductive layer or from a conductive substrate. While capacitor areas are quite controllable, dielectric thickness is not. Thus, while capacitance values are not highly controllable, ratios of capacitance values are, since dielectric thickness is quite uniform across a single semiconductor die.

Figure 2:
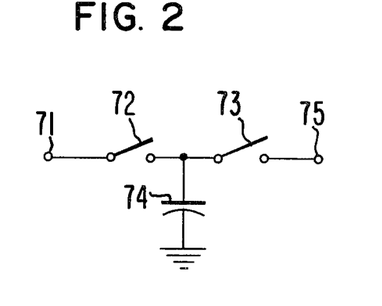
FIG. 2 is a resistor equivalent circuit utilizing a switched capacitor technique.

One method of circumventing the problem of uncontrollable RC time constants in MOS devices is to replace each resistor with a switched capacitor, as described by Caves, et al., in "Sampled Analog Filtering Using Switched Capacitors As Resistor Equivalents", IEEE JSSC, Volume SC-12, Number 6, Dec. 1977. One such switched capacitor resistor equivalent is shown in FIG. 2. Terminals 71 and 75 are available as equivalents to the terminals available on a resistor. Capacitor 74 has a capacitance value of C. Switch 72 is connected in series between input terminal 71 and capacitor 74, and controls when the input voltage is applied to capacitor 74 from terminal 71.

Switch 73 is connected in series between output terminal 75 and capacitor 74, and controls when the voltage stored in capacitor 74 is applied to output terminal 75. In practice, switches 72 and 73 are controlled by two clock generators having the same frequency of operation but generating non-overlapping control pulses. When the clock controlling switch 72 goes high, switch 72 closes, thus causing capacitor 74 to be charged to the input voltage applied to terminal 71. Because the two clock generators are non-overlapping, switch 73 is open during this charge cycle. Switch 72 then opens. Then switch 73 closes, while switch 73 remains open, thus applying the voltage stored on capacitor 74 to terminal 75.

This resistor equivalent circuit of FIG. 2 simulates a resistor having resistance value R by the following equation:

$$R = t/C_R \qquad (2)$$

where t is the period of switches 72 and 73, in seconds, and $C_R$ is the capacitance of resistor equivalent capacitor 74. From equations 1 and 2 we can see that the time constant for the integrator of FIG. 1 utilizing a switched capacitor as a resistor equivalent will be $$T = C/C_R \qquad (3)$$

or that the bandwidth will be $$BW = fC_R/C \qquad (4)$$

where f is the frequency of operation of switch 72 and switch 73 and is equal to 1/t. Since the time constant of an integrator utilizing a switched capacitor as a resistor equivalent is dependent on the ratio of capacitors, it is possible to construct many devices having a uniform capacitance ratio and thus uniform time constants.

Figure 3:
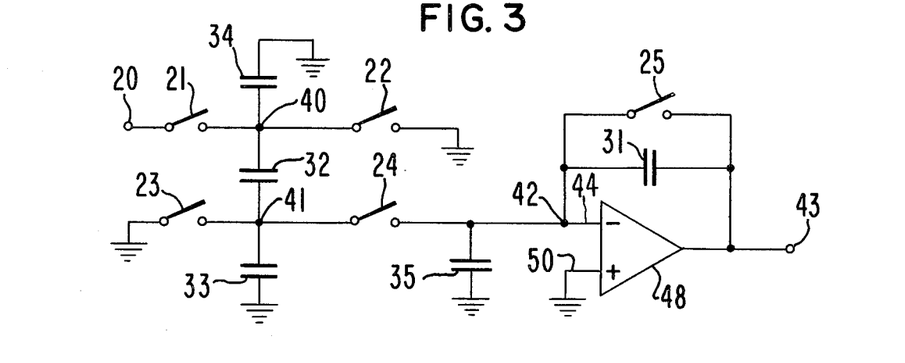
FIG. 3 is a circuit equivalent to the integrator shown in FIG. 1 utilizing switched capacitors in place of the resistive element.

A circuit equivalent to the integrator shown in FIG. 1 utilizing switched capacitor resistor equivalents is shown in FIG. 3. Capacitor 31 having capacitance value of $C_1$ provides negative feedback from output terminal 43 to inverting input terminal 44 of operational amplifier 48. Switch 25 is connected in parallel across capacitor 31 to provide means for discharging capacitor 31 and thus reinitializing the integrator. Non-inverting input terminal 50 of operational amplifier 48 is connected to ground. Capacitor 32 together with switches 21, 22, 23 and 24 provide the switched capacitor resistor equivalent. Capacitor 32 has a capacitance value of $C_2$. Capacitors 33 and 34 are connected between nodes 41 and 40 and ground, respectively, in order to attenuate the effects of noise impulses generated when switches 21, 22, 23 and 24 open. Capacitor 35 is connected between node 42 and ground in order to further attenuate the effects of noise impulses generated when switch 24 opens.

Figure 4:
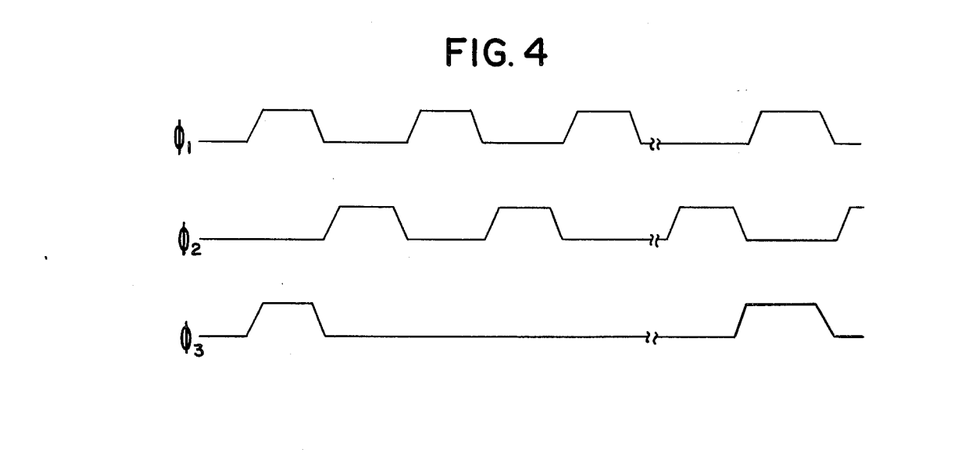
FIG. 4 is a graphical representation of the three clock generator signals used to control the circuit of FIGS. 3 and 8.

The operation of the circuit of FIG. 3 requires three separate control signals. Periodic clock signals suitable for this purpose are shown in FIG. 4. $\phi_3$ is used to drive switch 25 and has a frequency of $f_3$. For each positive going pulse of $\phi_3$, switch 25 is closed, thereby discharging capacitor 31 and reinitializing the integrator. The frequency $f_1$ of $\phi_1$ is equal to an integral multiple of that of $\phi_3$, such that $f_1 = Nf_3$. Typically N equals on the order of 1000. $\phi_2$ runs at the same frequency as $\phi_1$ such that $f_2$ equals $f_1$. As shown in FIG. 4 however, while $\phi_2$ has the same frequency as $\phi_1$, it is delayed in such a manner that $\phi_1$ and $\phi_2$ are nonoverlapping clock signals of the same frequency. In actual practice, $\phi_1$, $\phi_2$ and $\phi_3$ may be supplied from other circuits and need not be periodic clocks, as long as $\phi_1$ and $\phi_2$ do not overlap.

During operation of the circuit of FIG. 3, both $\phi_1$ and $\phi_3$ go high at the same time as shown in FIG. 4. $\phi_3$ controls switch 25 such that a positive going pulse on $\phi_3$ will cause switch 25 to close, thus discharging capacitor 31 and reinitializing the integrator. $\phi_1$ controls switches 21 and 23 such that a positive going pulse on $\phi_1$ causes switches 21 and 23 to close. $\phi_2$ controls switches 22 and 24 such that a positive going pulse on $\phi_2$ causes switches 22 and 24 to close. During the reinitialization period of the integration cycle, $\phi_1$ is high, $\phi_2$ is low and $\phi_3$ is high. Thus switch 25 is closed, switches 21 and 23 are closed and switches 22 and 24 are open. Switch 25 shorts out capacitor 31 causing it to discharge. Furthermore, the voltage appearing at output terminal 43 of operational amplifier 48 is connected to the inverting input terminal of operational amplifier 48 forcing the voltage on inverting terminal 44, and thus charging capacitor 35 to $V_{OFF}$, the magnitude of the offset voltage of operational amplifier 48. At the same time capacitor 32 is charged to $V_{IN}$, the input voltage applied to terminal 20.

$\phi_3$ goes low, thus causing switch 25 to open, with $V_{OFF}$ remaining on capacitor 35. As switch 25 opens, a spurious voltage denoted as $V_{SW1}$ is applied to capacitor 31 and stored therein. The mechanism of this spurious voltage generation is explained later. The output voltage on terminal 43 is now $V_{OFF}+V_{SW1}$. $\phi_1$ goes low causing switches 21 and 23 to open leaving $(V_{IN}+V_{SW2})$ stored on capacitor 32, where $V_{SW2}$ is a spurious voltage generated as switches 21 and 23 open. $\phi_2$ then goes high with $\phi_1$ and $\phi_3$ both low, thus causing switches 22 and 24 to close. This causes a voltage of magnitude $(-V_{IN1}-V_{SW2})$ to be applied between node 42 and ground. This causes the output voltage appearing on terminal 43 to change by $$\frac{C_2}{C_1}(V_{IN1} - V_{OFF} + V_{SW2})$$

At this point the magnitude of the output voltage ($V_{OUT}$) of the integrator available at terminal 43 is given by equation 5.

$$V_{OUT} = V_{OFF} + V_{SW1} + \frac{C_2}{C_1}V_{SW2} + \frac{C_2}{C_1}(V_{IN1} - V_{OFF}) \quad (5)$$

Referring again to FIG. 4, $\phi_2$ goes low thus causing switches 22 and 24 to open. $\phi_1$ then goes high, causing switches 21 and 23 to close, again charging capacitor 32 to $V_{IN}$, as applied to terminal 20. $\phi_1$ then goes low causing switches 21 and 23 to open, generating spurious voltage $V_{SW2}$, with capacitor 32 remaining charged to $(V_{IN2}+V_{SW2})$. $\phi_2$ then goes high causing switches 22 and 24 to close, again resulting in $(-V_{IN2}-V_{SW2})$ (as stored in capacitor 32) being applied in parallel with $V_{OFF}$ (as stored in capacitor 35) to the inverting input of operational amplifier 48. Again, the output voltage at terminal 43 of operational amplifier 48 is changed by $$\frac{C_2}{C_1}(V_{IN2} - V_{OFF} + V_{SW2})$$

The voltage appearing at output terminal 43 after two integrating cycles is shown by Equation 6.

$$V_{OUT2} = V_{OFF} + V_{SW1} + 2\frac{C_2}{C_1}V_{SW2} + \quad (6)$$

$$\frac{C_2}{C_1}(V_{IN1} - V_{OFF}) + \frac{C_2}{C_1}(V_{IN2} - V_{OFF})$$

Just prior to the reinitialization cycle (when $\phi_3$ goes high) after N integrating cycles, the output voltage of the integrator available at terminal 43 is given by Equation 7.

$$V_{OUT} = V_{OFF} + V_{SW1} + N\frac{C_2}{C_1}V_{SW2} + \quad (7)$$

$$\frac{C_2}{C_1}\sum_{i=1}^{N}(V_{INi} - V_{OFF})$$

The error component of Equation 7 is shown in Equation 8.

$$V_{(OUT)error} = V_{OFF} + V_{SW1} + N\frac{C_2}{C_1}V_{SW2} - \frac{NC_2}{C_1}V_{OFF} \quad (8)$$

The error voltage is comprised of the offset voltage of operational amplifier 48, the spurious voltage generated when switch 25 is opened, N times the spurious voltage generated when switch 22 is opened, and N times a fraction of $V_{OFF}$.

Figure 5:
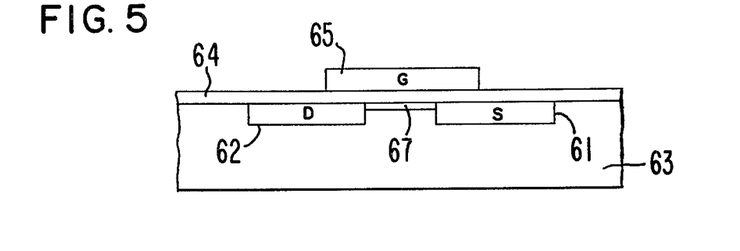
FIG. 5 is a cross-sectional view of an MOS transistor which can be used for each of the switches in the circuits of FIGS. 3 and 8.

That portion of the error voltage attributable to spurious voltages generated by opening of switches 25 and 24, denoted by $V_{SW1}$ and $V_{SW2}$, is generated by two mechanisms when MOS transistors are used to perform the functions of switches 24 and 25. A cross-sectional view of an MOS transistor used as a switch is shown in FIG. 5. Drain 62 and source 61 are formed of one conductivity type in substrate 63 of opposite conductivity type. Oxide layer 64 is placed over substrate 63 as shown, and provides electrical insulation between gate 65 and source 61, drain 62 and substrate 63. Due to the overlap of the gate region 65 above source 61 and drain 62, gate 65 is capacitively coupled to both source 61 and drain 62. Thus, spurious voltages may be generated on the output signal from a switch via capacitive coupling between elements of the MOS transistor serving as a switch.

A second mechanism of generating spurious voltages in a MOS transistor functioning as a switch is due to parasitic charge injection. As shown in FIG. 5, channel 67 is formed when gate 65 goes high (in an N-channel device) thus allowing current flow between source 61 and drain 62 through channel 67. When gate 65 goes low, the electric field formed by gate 65 is removed. Electrons forming channel 67 (as in an N-channel MOS device) will cease to concentrate and the transistor will turn off. The electrons contained in channel 67 when gate 65 goes low will migrate to the source 61 or drain 62 or disperse into substrate 63. Those electrons contained in channel 67 which move to source 61 cause a parasitic charge to be deposited on the circuitry connected to source 61. A similar parasitic charge is deposited through drain 62 to its associated circuitry.

This capacitive coupling and parasitic charge injection will alter the voltage stored on a connected capacitor by a magnitude denoted as $V_{SW}$. $V_{SW}$ can be minimized by minimizing each of its two components. An MOS transistor that will be used as a switch can be designed so as to have a minimum of overlap between its gate and its drain and source regions, thus minimizing the parasitic capacitance of the transistor. The effects of parasitic charge injection when turning off an MOS transistor may be minimized by using capacitors of sufficient size such that the charge stored on each capacitor will be many times that charge parasitically injected during the turn off of the switch. Furthermore, CMOS devices may be used as a switch with the result that the effect of electron injection caused when the n-channel turns off is effectively cancelled by the hole injection caused when the P-channel turns off.

Figure 6A:
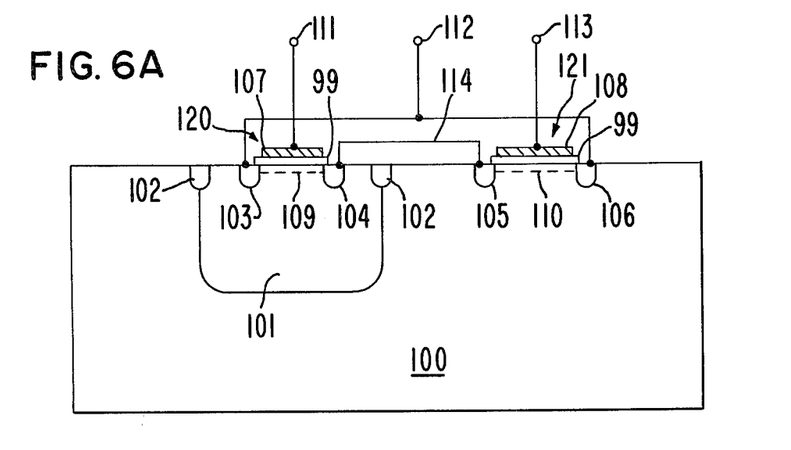
FIG. 6A is a cross-sectional view of a CMOS transistor which can be used as a switch in the circuits of FIGS. 3 and 8.
Figure 6B:
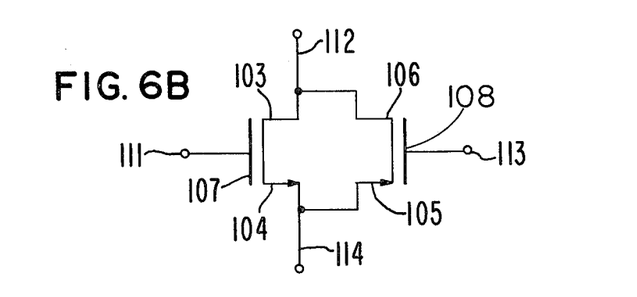
FIG. 6B is a schematic diagram of the CMOS transistor of FIG. 6A.
Figure 6C:
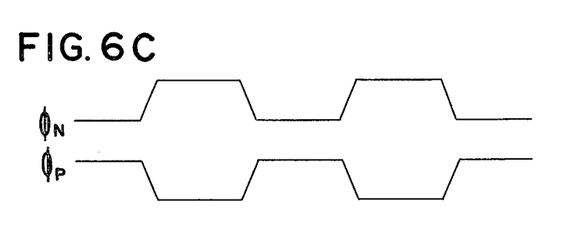
FIG. 6C is a diagram of the two clock signals used to drive a complementary pair of MOS transistors which function as a single switch.

A cross-sectional view of a CMOS transistor which may be used as a switch in this invention is shown in FIG. 6A. The schematic diagram corresponding to FIG. 6A is shown in FIG. 6B. Substrate 100 is doped with N-type impurities. P-well 101 is formed within substrate 100 as shown. Channel stops 102 of P-type conductivity are used to isolate the N channel transistor 120 formed within P-well 101 from the P channel transistor 121 formed within N doped substrate 100. N channel transistor 120 contains N doped source region 104 and N doped drain region 103 within P-well 101. Gate 107 is formed on substrate 100 as shown, and is connected to terminal 111. Gate 107 is separated from P-well 101 by electrical insulation layer 99. N channel 109 is formed between source 104 and drain 103 as shown. Complementary P channel transistor 121 is formed in N substrate 100 in a similar manner and contains P-type source 105, P-type drain 106, gate 108 connected to gate terminal 113, and P channel 110 as shown. Gate 108 is separated from substrate 100 by electrical insulation layer 99. Sources 104 and 105 are interconnected, as are drains 103 and 106. Gates 111 and 113 are driven by clocks of opposite polarity, as shown in FIG. 6C.

With $\phi_N$ connected to N channel gate terminal 111, and $\phi_P$ connected to P-channel gate terminal 113, capacitive coupling between gates 107 and 108, and drains 103 and 106, and between gates 107 and 108 and sources 104 and 105 are exactly cancelled when P channel transistor 121 and N channel transistor 120 are fabricated as mirror images, as is generally done for CMOS devices. Furthermore, electron migration caused when N channel transistor 120 turns off is exactly cancelled by hole migration caused when P channel transistor 121 turns off. Thus, switching noise is effectively eliminated.

Figure 7:
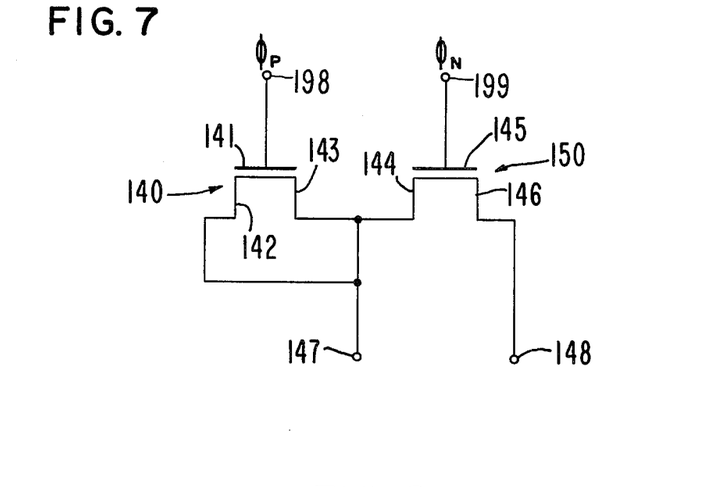
FIG. 7 shows an n-channel MOS transistor switch being used in conjunction with a dummy switch to minimize noise generated by parasitic charge injection.

Another method of minimizing the effects of charge injections and parasitic capacitance is the use of N-channel MOS transistors as switches, with N-channel dummy switches connected as shown in FIG. 7. N-channel switch 150 contains source 144, drain 146 and gate 145. Gate 145 is driven by $\phi_N$, as shown in FIG. 6C. N-channel switch 140 contains source 142, drain 143 and gate 141. Gate 141 is driven by $\phi_P$, as shown in FIG. 6C, which is simply $\phi_N$ inverted. Terminals 147 and 148 form the terminals of the switch formed by transistors 140 and 150. Capacitive coupling between gate 145 and source 144 is exactly cancelled by capacitive coupling between gate 141 and source 142 and between gate 141 and drain 143. Alternatively, P-channel switches can be used with P-channel dummy switches, in a similar manner.

A method of eliminating the first term of the output error voltage of Equation (8), $V_{OFF}$, is described in U.S. patent application Ser. No. 79,339, filed Sept. 27, 1979, which is assigned to the assignee of this invention. Thus, utilizing prior art techniques of reducing the effects of parasitic charge injection while switching MOS transistors, parasitic capacitance inherent in MOS transistors and the effects of operational amplifier offset expressed as the first term in equation (8), the error voltage in a switched capacitor integrator reduces simply to:

$$V_{(out)error} = -\frac{NC_2}{C_1} V_{OFF} \quad (9)$$

This remaining term is a single major error source in the switched capacitor integrator of FIG. 3. For operational amplifiers utilizing MOS circuitry, a $V_{OFF}$ of 10 millivolts is common. If the integrator operates for 1,000 cycles before reinitialization, and has a ratio of $C_2$ to $C_1$ of 1, the error would be 10 volts, clearly an intolerable error for practical systems.

Figure 8:
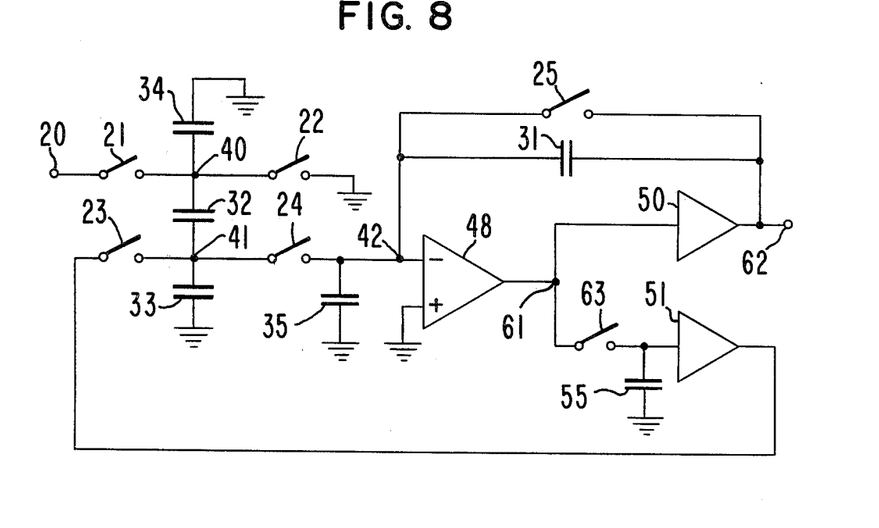
FIG. 8 is a switched capacitor integrator similar to that of FIG. 3 but incorporating the principles of this invention.

Shown in FIG. 8 is a circuit of this invention which is designed in such a manner as to eliminate or at least substantially reduce the effects of this last remaining error term as expressed in Equation (9). This circuit is a further refinement of the circuit as shown in FIG. 3 and components performing similar functions in both circuits have been numbered similarly. Capacitor 35 is a combination of parasitic capacitance and operational amplifier input capacitance and is charged to $V_{OFF}$ during the initialization period, when switch 25 is closed. Capacitor 32 (having a capacitance of $C_2$), together with switches 21, 22, 23 and 24 form a resistor equivalent which together with capacitor 31 (with capacitance $C_1$) form the time constant of the integrator. During the initialization period, $\phi_3$ of FIG. 4 is high, thus causing switches 25 and 63 to close. This stores $V_{OFF}$ on capacitor 35 through switch 25 from unity gain amplifier 50. $V_{OFF}$ is also stored on capacitor 55 through switch 63. $\phi_1$ is also high during this initialization period causing switches 21 and 23 to be closed. This causes $V_{OFF}$ to appear at node 41 from unity gain amplifier 51. Capacitor 32, connected between nodes 41 and 40 is thus charged to a value of ($V_{IN} - V_{OFF}$), $V_{IN}$ being applied at terminal 20. $\phi_3$ then goes low, thus opening switches 25 and 63. $V_{OFF}$ remains on capacitors 35 and 55. $\phi_1$ then goes low thus opening switches 21 and 23. $\phi_2$ then goes high causing switches 22 and 24 to close, thus applying ($V_{OFF} - V_{IN}$) to node 42. This causes the output of the unity gain amplifier 50 available at terminal 62 to change by $$\frac{C_2}{C_1} V_{IN1}.$$

$\phi_2$ then goes low opening switches 22 and 24. $\phi_1$ then goes high, closing switches 21 and 23. $V_{OFF}$ is still stored on capacitor 55 and amplified through unity gain amplifier 51 to node 41. Amplifier 51 serves as a buffer, allowing virtually no discharge of capacitor 55. Capacitor 32 is again charged to ($V_{IN} - V_{OFF}$). $\phi_1$ then goes low causing switches 21 and 23 to open, and $\phi_2$ goes high causing switches 22 and 24 to close. The magnitude of the output voltage appearing at terminal 62 at this time is equal to:

$$V_{OUT2} = V_{OFF} + \frac{C_2}{C_1}(V_{IN1}) + \frac{C_2}{C_1}(V_{IN2}) \quad (10)$$

At the end of N cycles, just prior to reinitialization, the output voltage available on terminal 62 is:

$$V_{OUT} = V_{OFF} + \sum_{i=1}^{N} V_{INi}(C_2/C_1) \quad (11)$$

Utilizing a further refinement, as described in the aforesaid copending application, the remaining error term, $V_{OFF}$, is eliminated resulting in an output voltage:

$$V_{OUT} = \sum_{i=1}^{N} V_{IN_i}(C_2/C_1) \qquad (12)$$

Thus by utilizing well known techniques to minimize parasitic capacitance and parasitic charge injection in MOS transistors used as switches, and by utilizing the circuit of this invention, a switched capacitor integrator is constructed which internally compensates for the undesired and often intolerable effects of the offset voltages characteristic of operational amplifiers used in integrators.

I claim:

1. An integrator having an integrator input terminal for receiving an input voltage to be integrated and an integrator output terminal, comprising:
   an operational amplifier having an inverting input terminal, a non-inverting input terminal connected to a reference potential, and an output terminal, said operational amplifier producing an offset output voltage on said output terminal;
   a capacitor connected between the inverting input terminal and the output terminal of said operational amplifier;
   switched capacitor means connected between said inverting input terminal and said integrator input terminal; and
   means for eliminating the effect of said offset output voltage on said integrator output terminal, said means for eliminating comprising means for storing a stored voltage equal to said input voltage to be integrated minus said offset output voltage and means for applying said stored voltage to said inverting input terminal of said operational amplifier, whereby said input voltage is integrated and said offset output voltage is not integrated.

2. Structure as in claim 1 further comprising an offset voltage source other than said operational amplifier, providing a voltage equal to said output offset voltage of said operational amplifier, wherein said switched capacitor means includes a switched capacitor having a first and a second plate, and wherein said means for eliminating first causes said switched capacitor to be charged to a voltage equal to said input voltage to be integrated minus said output offset voltage of said operational amplifier as provided by said offset voltage source by first connecting said first plate to the input voltage and connecting said second plate to said offset voltage source and then causing said first plate to be connected to said reference potential and said second plate to be connected to the inverting input terminal of said operational amplifier.

3. Structure as in claim 2 wherein said offset voltage source is a sample and hold circuit comprising:
   a storage capacitor having a first and a second plate, said second plate connected to said reference potential;
   switch means for connecting the output terminal of said operational amplifier to said first plate of said storage capacitor only when the voltage on said output terminal of said operational amplifier is equal to said offset output voltage;
   an offset buffer amplifier having an input lead and an output lead, said input lead connected to said storage capacitor first plate;
   whereby a constant voltage equal to the offset output voltage of said operational amplifier is available on said output lead of said offset buffer amplifier during the complete integration cycle.

4. Structure as in claim 3 wherein said integrator further includes an additional buffer amplifier having characteristics closely matched to the characteristics of said offset buffer amplifier, and wherein an offset voltage difference between the output voltage and the input voltage of said offset buffer amplifier is substantially equal to an offset voltage difference between the output voltage and the input voltage of said additional buffer amplifier, and wherein said additional buffer amplifier has an input lead connected to said output terminal of said operational amplifier and an output lead connected to said integrator output terminal;
   whereby the effect on the output voltage of said integrator due to said offset voltage of said offset buffer amplifier is eliminated by the presence of said additional buffer amplifier.

5. An integrator having an input terminal for receiving an input voltage to be integrated and an output terminal, comprising:
   an operational amplifier having an inverting input lead, a noninverting input lead connected to a reference voltage, and an output lead, said operational amplifier producing a first offset output voltage on said output lead;
   a first buffer amplifier having an input lead connected to said output lead of said operational amplifier and an output lead connected to said output terminal of said integrator, said first buffer amplifier producing a second offset output voltage on said output lead of said first buffer amplifier;
   a second buffer amplifier having an input lead and an output lead, said second buffer amplifier producing a third offset output voltage on its output lead;
   a capacitor connected between said inverting input lead of said operational amplifier and said output terminal of said integrator;
   first switch means connected between said inverting input lead of said operational amplifier and said output terminal of said integrator;
   second switch means connected between said output lead of said operational amplifier and said input lead of said second buffer amplifier;
   a storage capacitor connected between said input lead of said second buffer amplifier and said reference voltage; and
   switched capacitor means connected between said input terminal of said integrator and said inverting input lead of said operational amplifiers, said switched capacitor means including
      a switched capacitor having a first and a second plate;
      third switch means connected between said first plate and said input terminal of said integrator;
      fourth switch means connected between said first plate and said reference voltage;
      fifth switch means connected between said second plate and said output lead of said second buffer amplifier;
      sixth switch means connected between said second plate and said inverting input lead of said operational amplifier;
   wherein, during an initialization period,
      said first and second switch means are closed and said sixth switch means is open, thereby generating an integrator offset voltage on said output terminal of said integrator equal to the sum of said first and said second offset output voltages;

said storage capacitor is charged to a voltage equal to said first offset output voltage;

said second buffer amplifier generates on said output lead of said second buffer amplifier a voltage equal to said integrator offset voltage; and wherein said first and second switch means are open during periods other than said initialization period and said input voltage is integrated by closing said third and said fifth switch means and opening said fourth and said sixth switch means, thereby storing on said switched capacitor a voltage equal to said input voltage minus said integrator offset output voltage; and opening said third and said fifth switch means and closing said fourth and said sixth switch means, thereby integrating said input voltage and preventing the integration of said integrator offset output voltage.

6. Structure as in claim 5 wherein said switch means are transistors.

7. Structure as in claim 6 wherein said transistors are MOS transistors.

* * * * *

UNITED STATES PATENT AND TRADEMARK OFFICE
CERTIFICATE OF CORRECTION

PATENT NO. : 4,365,204
DATED : December 21, 1982
INVENTOR(S) : Yusuf A. Haque

It is certified that error appears in the above—identified patent and that said Letters Patent is hereby corrected as shown below:

In Column 4, line 13, in the equation (3) delete "$T=C/C_R$" and insert --$T=tC/C_R$--.

Signed and Sealed this

Second Day of August 1983

[SEAL]

Attest:

GERALD J. MOSSINGHOFF

Attesting Officer

Commissioner of Patents and Trademarks